(12) United States Patent
Soon (10) Patent No.: US 9,312,419 B2
(45) Date of Patent: Apr. 12, 2016

(54) SOLAR ENERGY CONVERTER

(75) Inventor: Choon Sen Soon, Singapore (SG)

(73) Assignee: ALPHA SOLAR PTE. LTD., Singapore (SG)

( * ) Notice: Subject to any disclaimer, the term of this patent is extended or adjusted under 35 U.S.C. 154(b) by 62 days.

(21) Appl. No.: 14/115,856

(22) PCT Filed: Feb. 8, 2012

(86) PCT No.: PCT/SG2012/000036
§ 371 (c)(1),
(2), (4) Date: Feb. 20, 2014

(87) PCT Pub. No.: WO2012/154123
PCT Pub. Date: Nov. 15, 2012

(65) Prior Publication Data
US 2014/0182658 A1    Jul. 3, 2014

(30) Foreign Application Priority Data

May 6, 2011    (SG) ................ 201103269-5

(51) Int. Cl.
*H02N 6/00*    (2006.01)
*H01L 31/042*    (2014.01)
(Continued)

(52) U.S. Cl.
CPC .............. *H01L 31/0521* (2013.01); *F24J 2/08* (2013.01); *F24J 2/202* (2013.01); *H01L 31/048* (2013.01);
(Continued)

(58) Field of Classification Search
CPC .............. H01L 31/052; H01L 31/0521; H01L 31/0543; H01L 31/054; Y02E 10/52; H02S 40/20; H02S 40/22; H02S 40/40; H02S 40/42; H02S 40/425; H02S 40/44
USPC ........................................... 136/246
See application file for complete search history.

(56) References Cited

U.S. PATENT DOCUMENTS 3,995,615 A * 12/1976 Hojnowski ................... 126/670
4,042,417 A    8/1977 Kaplow et al.
(Continued)

FOREIGN PATENT DOCUMENTS

AT    508646 A1    3/2011
DE    19837189 C1    8/1998
(Continued)

OTHER PUBLICATIONS

Baker, Richard, International Search Report, PCT/SG2012/000036, Apr. 10, 2012, 5 pages, Australian Patent Office.
(Continued)

*Primary Examiner* — Eli Mekhlin
(74) *Attorney, Agent, or Firm* — Henricks, Slavin & Holmes LLC (57) ABSTRACT

According to one aspect, there is provided a solar energy converter, including: a lens; a base plate having a first surface that faces the lens and a second surface that is opposite to the first surface; and a solar cell sandwiched between the lens and the base plate, wherein both the lens and the base plate are each provided with at least one channel for fluid for cooling the solar cell. Also contemplated is provision of at least one fin on both the lens and the base plate for cooling the solar cell. According to a second aspect, there is provided a method for cooling a solar energy converter having a lens, a base, and at least one solar cell sandwiched between said lens and said base plate, the method comprising the step of: cooling the at least one solar cell on two opposing sides.

25 Claims, 6 Drawing Sheets

(51) Int. Cl.
*H01L 31/052* (2014.01)
*H01L 31/048* (2014.01)
*F24J 2/08* (2006.01)
*F24J 2/20* (2006.01)
*H01L 31/054* (2014.01)

(52) U.S. Cl.
CPC .......... *H01L 31/052* (2013.01); *H01L 31/0543* (2014.12); *Y02E 10/44* (2013.01); *Y02E 10/52* (2013.01)

(56) References Cited

U.S. PATENT DOCUMENTS

| | | | | |
|---|---|---|---|---|
| 4,134,393 | A | * | 1/1979 | Stark et al. .................. 126/581 |
| 4,320,246 | A | * | 3/1982 | Russell ......................... 136/248 |
| 4,397,303 | A | | 8/1983 | Stultz |
| 6,013,873 | A | * | 1/2000 | Daito ................ H01L 31/02013 136/243 |
| 2007/0215198 | A1 | * | 9/2007 | Jiang et al. .................... 136/246 |
| 2008/0083450 | A1 | * | 4/2008 | Benoit et al. .................. 136/246 |
| 2010/0051102 | A1 | | 3/2010 | Lin |
| 2011/0079276 | A1 | | 4/2011 | Nishino et al. |

FOREIGN PATENT DOCUMENTS

| | | |
|---|---|---|
| EP | 0116521 A2 | 8/1984 |
| EP | 2246914 A1 | 11/2010 |
| JP | 56-104153 | 12/1955 |
| JP | 53-8093 | 1/1978 |
| JP | 56-126981 | 10/1981 |
| JP | 57-026478 A | 2/1982 |
| JP | S59097457 | 6/1984 |
| JP | 10-252640 A | 9/1998 |
| JP | 2007-214446 A | 8/2007 |
| WO | WO 2009/061493 A1 | 5/2009 |
| WO | WO 2009/134208 A1 | 11/2009 |

OTHER PUBLICATIONS

Ferro Pozo, Jose, European Supplemental Search Report, EP12782366, Oct. 9, 2014, 6 pages, EPO.

Japan Office Action dated Nov. 17, 2015 in co-pending related Application No. JP 2014-509269, 3 pages and English translation of Office Action, 3 pages.

* cited by examiner

FIGURE 6

SOLAR ENERGY CONVERTER

CROSS REFERENCE TO RELATED APPLICATIONS

This application is a National Stage of International Application No. PCT/SG2012/000036, filed Feb. 8, 2012.

FIELD OF THE INVENTION

The invention relates to a solar energy converter.

BACKGROUND

Solar energy can be converted into other forms of energy, such as thermal or electrical energy, through the use of a solar energy converter.

A solar energy converter may have a lens, a heat exchanger and a solar cell. The lens focuses sunlight onto the solar cell which converts solar energy into electrical energy. The heat exchanger converts the solar energy into thermal energy.

There are several drawbacks to such a solar energy converter.

The temperature of the solar cells, during normal operating conditions, rises higher than the optimum operating temperature, which is typically 25° C. The temperature rise of the solar cells is due to the heat from the sun being transmitted directly on to the solar cells through a lens, typically fabricated from glass. Since the efficiency of a solar cell reduces when its temperature increases, the solar cell becomes less efficient during such normal operating conditions.

The lens is typically fabricated using tempered glass. Such a lens is heavy, expensive and can break.

Further, the solar energy converter is typically designed as a rigid flat panel because of the use of silicon solar cells. Such a rigid flat panel is not readily usable on uneven surfaces.

One or more of the above drawbacks is addressed in a solar energy converter according to various embodiments mentioned below.

SUMMARY OF THE INVENTION

According to one aspect of the invention, there is provided a solar energy converter, including: a lens; a base plate having a first surface that faces the lens and a second surface that is opposite to the first surface, wherein the second surface is exposed to form an outer surface of the solar energy converter; and a solar cell sandwiched between the lens and the base plate, wherein both the lens and the base plate are each provided with at least one channel system for fluid for cooling the solar cell. For example, it may be provided that the fluid absorbs heat from the sun before it heats up the at least one solar cell, where in one embodiment it is the fluid in the at least one channel system of the lens that absorbs the heat. Further, it may be provided that the fluid absorbs heat generated from the at least one solar cell when the at least one solar cell converts light energy into electrical energy.

Each of the lens, the at least one solar cell, and the base plate may define a plane, wherein the plane defined by the at least one solar cell is arranged between the plane defined by the lens and the plane defined by the base plate. These three planes may be arranged in parallel. The direction perpendicular to these planes is defined as first direction.

The term "channel system" (as used in the present application) of the lens or provided in the lens, respectively, (in short: channels system of the lens) may comprise or consist of one or more channels. These one or more channels may be channels according to the classical sense of the term "channel" and/or one or more chambers or any hollow space or spaces, or a combination thereof. The at least one channel according to the classical sense of the term "channel" may extend straight, or bent, or curved, or meander-shaped, or in any other suitable manner, or in according to a combination thereof. The channel system may consist of a plurality of channels and/or chambers and/or hollow spaces. The channel system of the lens may be closed and/or sealed to the outside of the lens, or one or more openings provided in the outer surface of the lens may be in fluid connection with the channel system, so that the channel system is open to the outside of the lens, wherein said at least one opening may serve for providing fluid into the channel system of the lens and/or discharging fluid out of the channel system of the lens. For example, the lens may have two or more openings to the outside of the lens, wherein one of these openings is or may be connected to a supply channel through which fluid may be continuously supplied into the lens, and wherein the other of these openings is or may be connected to a discharge channel through which fluid may be continuously discharged out of the lens. Effectively, with such a design, heat from the sun is absorbed by the cooling fluid before it heats up the at least one solar cell, which reduces the temperature of the at least one solar cell and improves the heat transfer out of the solar energy converter.

According to another embodiment of the invention, the channel system of the lens may have one or more openings to the outside of the lens, wherein these one or more openings are closed and/or sealed by means of detachable closure members.

The channel system of the lens may be filled with a fluid for heat absorption and cooling the at least one solar cell.

The channel system of the lens may have one or more branching.

All channels or chambers or hollow spaces belonging to the same channel system of the lens may be in fluid connection with each other, and in particular may be in fluid connection with each other within the lens.

The lens may comprise exactly one channel system for receiving or guiding fluid, respectively, for cooling the at least one solar cell. In another embodiment the lens may comprise more than one channel system, wherein all channels or chambers or hollow spaces belonging to the same channel system of the lens may be, for example within the lens, in fluid connection with each other, and wherein the different channel systems of the lens are not in fluid connection with each other.

At least one channel of the channel system of the lens may be designed as or delimited by a recess within or on the surface of the lens such that the at least one channel is open to the outside of the lens along its longitudinal direction. The at least one channel that is open to the outside of the lens along its longitudinal direction may be designed as recess provided in that outer surface of the lens, which outer surface is directed towards the at least one solar cells, for example. Such a design may be such, that the at least one channel is open in the direction towards the at least one solar cell or the first direction, respectively. The outer surface of the lens, which surface is directed to the solar cell may be corrugated, thereby forming channels of the channel system of the lens. However, the open side of such channels may be closed by a cover. For example, the at least one solar cell may serve as cover, or a member interposed between the at least one solar cell and the lens.

One, more, or all of the channels of the channel systems may be delimited by material such, that all cross-sections perpendicular to the longitudinal axis of the respective channel are completely surrounded by material. Said material may be material of the lens. In some alternative embodiments said material may be partly material of the lens and partly material of a member positioned adjacent to the lens and serving as cover.

The channel system of the lens may have a plurality of channels.

The channel system of the lens may have a plurality of channels arranged in parallel to each other.

Channels or all of channels of the channel system of the lens may be arranged in one plane or in different planes, for example. However, other configurations may be provided as well.

The cross-sectional shape of the channel or the channels of the channels system of the lens may be, for example, circular, or polygonal, or hemispherical, or ellipsoid, or convex, or concave, or triangular, or trapezoidal, or square, or rectangular, or octagonal, or pentagonal, or any other shape, or combination thereof. The channel system of the lens may have a plurality of channels having identical or various cross-sectional shapes. In particular, different channels may be different than the afore-mentioned cross-sectional shapes.

The distance or shortest distance, respectively, between the channel system of the lens and the solar cell may be less than 30% of the thickness of the solar energy converter, for example less than 25% of the thickness of the solar energy converter, or less than 20% of the thickness of the solar energy converter, or less than 15% of the thickness of the solar energy converter, or less than 10% of the thickness of the solar energy converter, or less than 8% of the thickness of the solar energy converter, or less than 5% of the thickness of the solar energy converter.

Fluid or cooling fluid, respectively, provided in or flowing through the channel system of the lens may be any fluid suitable for cooling and heat absorption. For example, the fluid may be a liquid, gas or air.

Fluid may be provided in the channel system of the lens, so as to absorb heat from the sun and cool the solar cell due to its position with regard to the solar cell. Thus, the lens performs the functions of absorbing heat from the sun before it heats up the solar cell, cooling of the solar cell and focusing and/or transmitting light onto the solar cell.

The lens may be, for example, an entirely solid object. The term lens as used in the present application may comprise a lens in the classical sense of the term "lens" or may comprise members that cause at least one optical refraction of with regard to a light beam beaming there through. For example, the lens may have one curved surface or two opposing curved surfaces. One surface of the lens may be convex and opposing surface of the lens may be concave. In alternative embodiments both of opposing surfaces of the lens may be concave. In yet other embodiments of the lens both of opposing surfaces of the lens may be convex. The lens may be designed so as to focus light, for example so as to focus light on the at least on solar cell. However, as an example for a lens that causes at least one optical refraction, the lens may designed as a plate having flat or molded surfaces.

The walls delimiting channels of the channel system of the lens or being allocated between adjacent channels of the channel system of the lens may have a cross-section or shape that is, for example, polygonal or hemispherical or ellipsoid or convex or concave or trapezoidal or triangular or rectangular or octagonal or pentagonal, or of any other shape. By providing such shapes or cross-sections, respectively, the light path of the light toward the at least one solar cell can be influenced.

The lens may be provided with a shock absorbing device. For example, such a shock absorbing device may be designed such that recesses or hollow spaces are located adjacent to the ends of walls delimiting adjacent channels of the channels system of the lens, which ends are directed to at least one the solar cell, so that the respective wall can slightly move into said recess or hollow space, respectively, upon a shock impacting the outer surface of the lens, which outer surface is opposite the surface (of the lens) facing the at least one solar cell. Accordingly, in one embodiment, the lens may have a surface that faces the at least one solar cell. The surface has at least one recess, wherein the lens has at least one wall located between two channels of the channel system, and wherein the at least one wall is located opposite to the at least one recess.

The term "channel system" (as used in the present application) of the base plate or provided in the base plate, respectively, (in short: channels system of the base plate) may comprise or consist of one or more channels. These one or more channels may be channels according to the classical sense of the term "channel" and/or one or more chambers or any hollow space or spaces, or a combination thereof. The at least one channel according to the classical sense of the term "channel" may extend straight, or bent, or curved, or meander-shaped, or in any other suitable manner, or in according to a combination thereof. The channel system may consist of a plurality of channels and/or chambers and/or hollow spaces. The channel system of the base plate may be closed and/or sealed to the outside of the base plate, or one or more openings provided in the outer surface of the base plate may be in fluid connection with the channel system, so that the channel system is open to the outside of the base plate, wherein said at least one opening may serve for providing fluid into the channel system of the base plate and/or discharging fluid out of the channel system of the base plate. For example, the base plate may have two or more openings to the outside of the base plate, wherein one of these openings is or may be connected to a supply channel through which fluid may be continuously supplied into the base plate, and wherein the other of these openings is or may be connected to a discharge channel through which fluid may be continuously discharged out of the base plate. Such a design will improve the heat transfer out of the solar energy converter.

According to another embodiment of the invention, the channel system of the base plate may have one or more openings to the outside of the base plate, wherein these one or more openings are closed and/or sealed by means of detachable closure members.

The channel system of the base plate may be filled with a fluid for cooling the at least one solar cell.

The channel system of the base plate may have one or more branching.

All channels or chambers or hollow spaces belonging to the same channel system of the base plate may be in fluid connection with each other, and in particular may be in fluid connection with each other within the base plate.

The base plate may comprise exactly one channel system for receiving or guiding fluid, respectively, for cooling the at least one solar cell. In another embodiment the base plate may comprise more than one channel system, wherein all channels or chambers or hollow spaces belonging to the same channel system of the base plate may be, for example within the base plate, in fluid connection with each other, and wherein the different channel systems of the base plate are not in fluid connection with each other.

At least one channel of the channel system of the base plate may be designed as or delimited by a recess within or on the surface of the base plate such that the at least one channel is open to the outside of the base plate along its longitudinal direction. The at least one channel that is open to the outside of the base plate along its longitudinal direction may be designed as recess provided in that outer surface of the base plate, which outer surface is directed towards the at least one solar cells, for example. Such a design may be such, that the at least one channel is open in the direction towards the at least one solar cell or the first direction, respectively. The outer surface of the base plate, which surface is directed to the solar cell may be corrugated, thereby forming channels of the channel system of the base plate. However, the open side of such channels may be closed by a cover.

One, more, or all of the channels of the channel systems may be delimited by material such, that all cross-sections perpendicular to the longitudinal axis of the respective channel are completely surrounded by material. Said material may be material of the base plate. In some alternative embodiments said material may be partly material of the base plate and partly material of a member positioned adjacent to the base and serving as cover.

The channel system of the base plate may have a plurality of channels.

The channel system of the base plate may have a plurality of channels arranged in parallel to each other.

Channels or all of channels of the channel system of the base plate may be arranged in one plane or in different planes, for example. However, other configurations may be provided as well.

The cross-sectional shape of the channel or the channels of the channels system of the base plate may be, for example, circular, or polygonal, or hemispherical, or ellipsoid, or convex, or concave, or triangular, or trapezoidal, or square, or rectangular, or octagonal, or pentagonal, or any other shape, or combination thereof. The channel system of the base plate may have a plurality of channels having identical or various cross-sectional shapes. In particular, different channels may be different than the afore-mentioned cross-sectional shapes.

The distance or shortest distance, respectively, between the channel system of the base plate and the solar cell may be less than 40% of the thickness of the solar energy converter, for example less than 35% of the solar energy converter, or less than 30% of the thickness of the solar energy converter, or less than 25% of the thickness of the solar energy converter, or less than 20% of the thickness of the solar energy converter, or less than 15% of the thickness of the solar energy converter, or less than 10% of the thickness of the solar energy converter, or less than 8% of the thickness of the solar energy converter, or less than 5% of the thickness of the solar energy converter.

Fluid or cooling fluid, respectively, provided in or flowing through the channel system of the base plate may be any fluid suitable for cooling For example, the fluid may be a liquid, gas or air.

Fluid may be provided in the channel system of the base plate, so as to cool the solar cell due to its position with regard to the solar cell. Thus, the base plate performs the functions of both cooling of the solar cell and providing a base.

The base plate may be, for example, an entirely solid object.

The material of the lens may comprise or consist of, for example, glass and/or polymer, for example poly(methyl methacrylate) (PMMA) and/or polycarbonate and/or acrylic and/or plastics and/or thermoplastics and/or thermosetting plastics, or any combination thereof, or any other suitable material. For example, the lens may comprise or consist of thermoplastics or thermosetting plastics. The lens may be transparent.

The lens may consist of only one material. Alternatively, the lens may consist of various materials.

The lens may comprise impact absorption material or consist of impact absorption material.

The material of the base plate comprise or consist of, for example, metal, for example aluminum or aluminum heatsink, and/or plastic and/or polymer, for example poly(methyl methacrylate) (PMMA) and/or polycarbonate and/or acrylic, and/or thermoplastics and/or thermosetting plastics, or any combination thereof. The base plate may consist of one material. Alternatively, the base plate may consist of various materials. In particular, the base plate may consist of plastic or polymer material, wherein the base plate is provided with fins made from metal, e.g. aluminum or aluminum heatsink.

The channel system of the lens may comprise a plurality of parallel channels, or channels of different channels systems of the lens may be in parallel.

The channel system of the base plate may comprise a plurality of parallel channels, or channels of different channels systems of the base plate may be in parallel.

The lens may comprise a plurality of parallel channels and the base plate may comprise a plurality of parallel channels, wherein these parallel channels of the base plate are non-parallel, for example perpendicular, to these parallel channels of the lens.

The lens may have a constant or a varying thickness. The base plate may have a constant or a varying thickness. It must be noted that the thickness of the lens or base plate, respectively, may be measured in the first direction.

A first adhesive layer may be provided between the lens and the solar cell, wherein a first or the upper surface of the adhesive layer is in contact with the lens, and wherein a second or lower surface of the first adhesive layer is in contact with the solar cell.

A second adhesive layer may be provided between the solar cell and the base plate, wherein a first or upper surface of the second adhesive layer is in contact with the solar cell and a second of lower surface of the second adhesive layer is in contact with the first surface of the base plate.

The first and/or second adhesive layers may be fabricated from ethylene vinyl acetate.

According to a further aspect of the invention a method for cooling a solar energy converter is provided, the solar energy converter having a lens, a base, and at least one solar cell sandwiched between said lens and said base plate, wherein said method comprises the step of: cooling the at least one solar cell on two opposing sides, wherein the lens is arranged on the one of these opposing sides, and wherein the base is arranged on the other of these opposing sides.

Cooling of the at least one solar cell may be performed, for example, by means of a fluid provided in or flowing through at least one first channel system provided in the base plate, and by means of a fluid provided in or flowing through at least on second channel system provided in the lens. For example, it may be provided that the fluid absorbs heat from the sun before it heats up the at least one solar cell, where in one embodiment it is the fluid in the second channel system provided in the lens that absorbs the heat. Further, it may be provided that the fluid absorbs heat generated from the at least one solar cell when the at least one solar cell converts light energy into electrical energy.

In the cases of flowing fluid, the fluid may pressurized or non-pressurized. The fluid may be a gas, for example air, or a liquid.

The method according to the invention may be, for example, performed by means of the solar energy converter according to the present invention.

BRIEF DESCRIPTION OF THE DRAWINGS

In the drawings, like reference characters generally refer to the same parts throughout the different views. The drawings are not necessarily to scale, emphasis instead generally being placed upon illustrating the principles of various embodiments. In the following description, various embodiments are described with reference to the following drawings, in which.

DETAILED DESCRIPTION

While embodiments have been particularly shown and described with reference to specific embodiments, it should be understood by those skilled in the art that various changes in form and detail may be made therein without departing from the spirit and scope of various embodiments as defined by the appended claims. The scope of various embodiments is thus indicated by the appended claims and all changes which come within the meaning and range of equivalency of the claims are therefore intended to be embraced. It will be appreciated that common numerals, used in the relevant drawings, refer to components that serve a similar or the same purpose.

Figure 1:
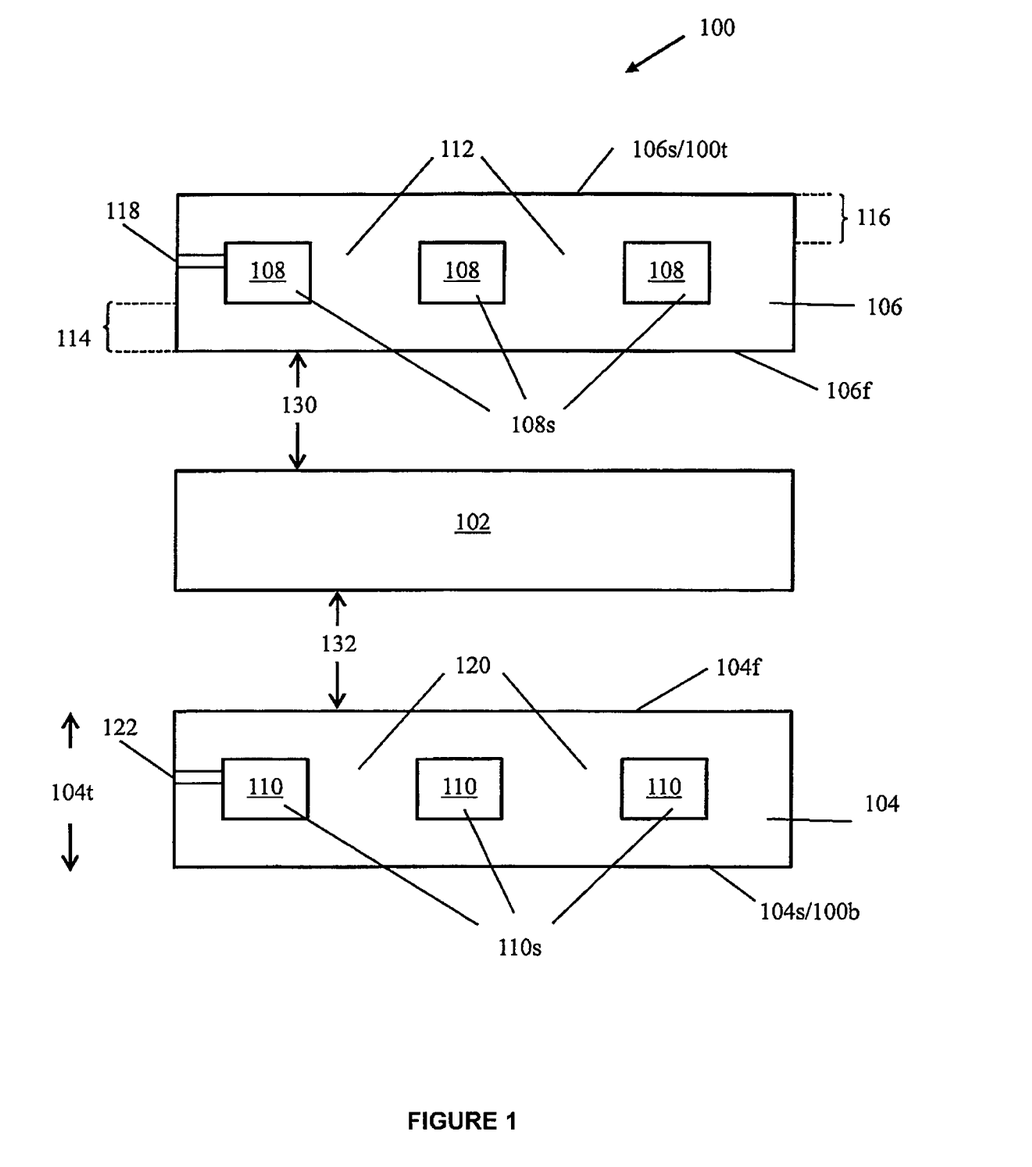
FIG. 1 shows a schematic of a solar energy converter in accordance with an embodiment.

FIG. 1 shows a schematic of a solar energy converter 100 in accordance with an embodiment.

The solar energy converter 100 has a solar cell 102 located or sandwiched, respectively, between a base plate 104 and a lens 106.

The base plate 104 has a first surface 104f that faces the solar cell 102 and a second surface 104s that is opposite to the first surface 104f, wherein the second surface 104s is exposed to form an outer surface 100b of the solar energy converter 100.

The lens 106 has a first surface 106f that faces the solar cell 102 and a second surface 106s that is opposite to the first surface 106f, wherein the second surface 106s is exposed to form an outer surface 100t of the solar energy converter 100.

The solar cell 102 is sandwiched between the lens 106 and the base plate 104, wherein both the lens 106 and the base plate 104 are each provided with at least one channel system (denoted 110s for the base plate 104 and 108s for the lens 106) having at least one channel (denoted 110 for the base plate 104 and 108 for the lens 106) for receiving or guiding fluid for cooling the solar cell 102. For example, it may be provided that the fluid absorbs heat from the sun before it heats up the solar cell 102, where in one embodiment it is the fluid in the at least one channel system 108s of the lens 106 that absorbs the heat. Further, it may be provided that the fluid absorbs heat generated from the solar cell 102 when the solar cell 102 converts light energy into electrical energy.

In FIG. 1, the distance 130 between the lens 106 and the solar cell 102, and the distance 132 between the solar cell 102 and the base plate 104 is such that the solar cell 102 is in sufficient proximity to both the base plate 104 or the channel system 110s of the base plate 104, respectively, and the lens 106 or the channel system 108s of the lens 106, respectively, so that fluid in the respective channel system 110s and 108s can absorb heat from the sun before it heats up the solar cell 102 and cool the solar cell 102. In use, the solar cell 102 heats up due to exposure to incident light. At high temperatures, the solar cell 102 converts solar energy into electrical energy less efficiently. Thus, heat absorption and cooling by the fluid ensures optimal operating conditions for the solar cell 102.

Expressing the distance 130 between the lens 106 and the solar cell 102 and the distance 132 between the lens 106 and the base plate 104 in terms of the thickness 104t of the base plate 104, the distance 130 between facing surfaces of the lens 106 and the solar cell 102 may be between 0 to 20%, for example between 0 to 10%, for example between 0 to 5% of the base plate thickness 104t. The distance 132 between facing surfaces of the solar cell 102 and the base plate 104 may be between 0 to 20%, for example between 0 to 10%, for example between 0 to 5% of the base plate thickness 104t. However, any other values may be used as well.

The outer surfaces 100t and 100b respectively form the top and bottom surfaces of the solar energy converter 100. In use, the solar energy converter 100 is arranged such that the top surface 100t is exposed to light or sun light, respectively.

The lens 106 has at least one wall 112 located between two channels 108 of the at least one channel system 108s of the lens 106. The wall 112 allows for a means to control fluid flow in the lens 106, especially when the wall 112 does not extend along the entire width (denoted 206w in FIG. 2) of the lens 106. Each wall 112 may have a gap (not shown) that allows fluid flow between two adjacent channels 108 of the channel system 108s. In this manner, fluid introduced into the lens 106 at a leftmost channel may continuously flow through the respective gap of each wall 112 to the rightmost channel, where the heated fluid may then be extracted.

In addition to providing a means to control fluid flow in the lens 106, each wall 112 acts as a light modulating structure that can further refract light that passes through the top section 116 of the lens 106. By adjusting the location of each channel 108 within the lens 106 (thereby shifting the location of the walls 112), the manner in which light transmits through the lens 106 can be controlled so that light can be directed to focus on specific areas of the solar cell 102. Thus the walls 112 also function as an array of internal lenses.

The cross-section of the wall 112 is rectangular. However, in other embodiments, the wall 112 may have a cross-section (not shown) that is hemispherical, ellipsoid, convex, concave or trapezoidal. Polygonal cross-sections such as square, octagonal or pentagonal are also possible. Nevertheless, the shapes of cross-sections of such walls shall not be delimited to the afore-mentioned shapes. The use of different cross-sections affect how light, transmitting through the lens 106, is refracted and eventually passes out from the bottom or base section 114, respectively, of the lens 106. Accordingly, the walls 112 may have different cross-sections to each other.

The lens 106 has a base section 114 having a surface (i.e. the first surface 1060 that faces the solar cell 102 and a top section 116 that is opposite to the base section 114. The surface 106f of the base section 114 that faces the solar cell 102 may have at least one recess (denoted 416 in FIGS. 4D and 4E), wherein the at least one wall 112 is located opposite to the at least one recess.

Figure 4A:
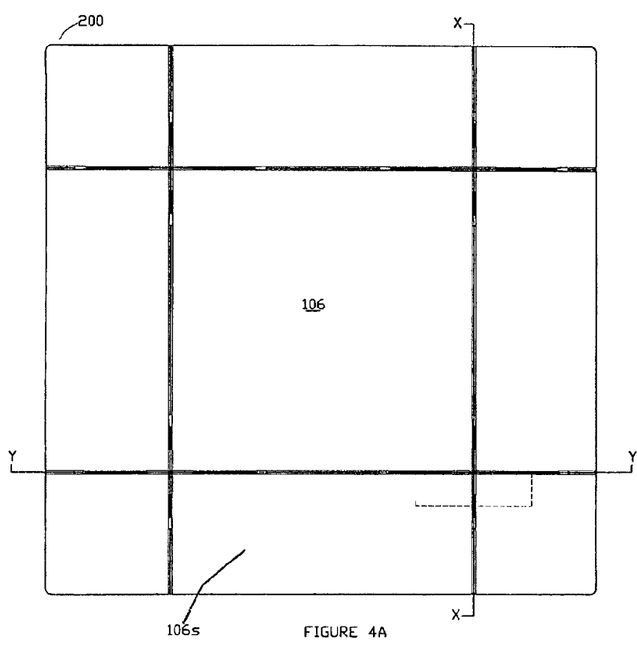
FIGS. 4A to 4E show various views of a solar energy converter in accordance with an embodiment.
Figure 4B:
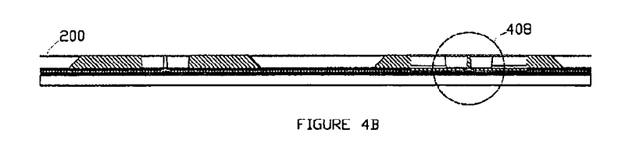
Figures 4C, 4D, 4E:
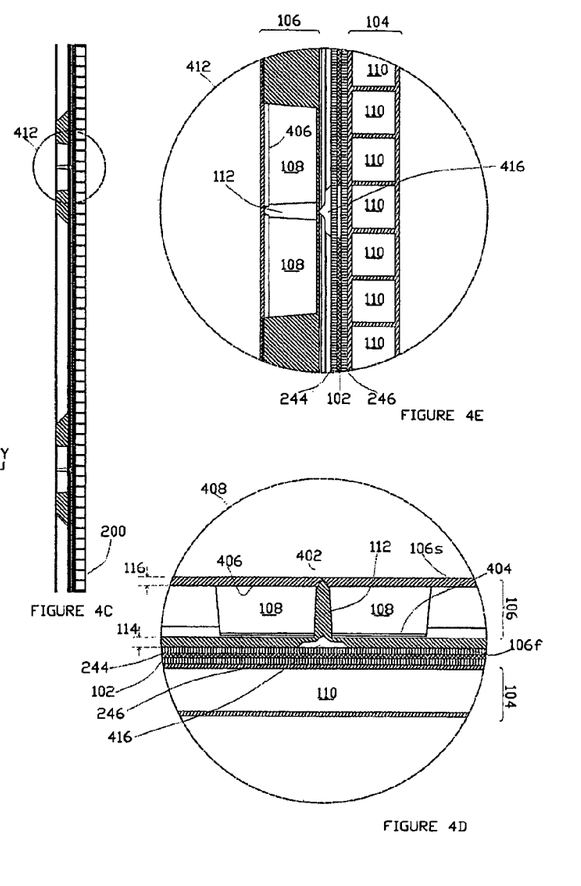

Referring to FIGS. 4D and 4E, the arrangement of the recess 416 and the wall 112 provides the lens 106 with a shock absorbing mechanism. When an object impacts on the portion 402 of the lens 106 adjacent to the wall 112 that protrudes from the portion of the lens 106 where the recess 416 is located, the wall 112 moves to occupy the space provided by the recess 416. A plurality of such shock absorbing mechanisms may be disposed at intervals across the lens 106, so that the lens 106 is provided with several impact points. Without this shock absorbing mechanism, there is a tendency for the at least one solar cell 102 to crack when impacted by objects.

In the embodiment shown in FIGS. 4D and 4E, the wall 112 located opposite to the at least one recess 416 extends from an inner surface 404 of the base section 114 of the lens 106 to an inner surface 406 of the top section 116 of the lens 106. In another embodiment (not shown), the wall 112 only extends from an inner surface 404 of the base section 114, but does not contact with the inner surface 406 of the top section 116 of the lens 106.

Returning to FIG. 1, the lens 106 has an opening 118 in communication with the at least one channel system 108s of the lens 106. The opening 118 is provided on an outer surface of the lens 106. The opening 118 allows for fluid to be extracted or introduced into the lens 106. Extraction may be performed when the fluid has reached above a predetermined temperature and the heated fluid is replaced with cool water. The extracted heated fluid can be piped for other uses. In another embodiment (not shown) where the lens 106 is air-cooled, the at least one channel system 108s of the lens 106 is sealed within the lens 106, wherein the fluid for cooling the solar cell 102 is within the at least one channel system 108s.

As shown in FIG. 1, the lens 106 has a channel system 108s comprising a plurality of channels 108. The plurality of channels 108 are arranged in parallel to each other.

The base plate 104 has at least one wall 120 located between two channels 110 of the at least one channel system 110s of the base plate 104. The wall 120 allows for a means to control fluid flow in the base plate 104, especially when the wall 120 does not extend along the entire width (denoted 204w in FIG. 2) of the base plate 104. Each wall 120 may have a gap (not shown) that allows fluid flow between two adjacent channels 110. In this manner, fluid introduced into the base plate 104 at a leftmost channel may continuously flow through the respective gap of each wall 120 to the rightmost channel, where the heated fluid may then be extracted.

The cross-section of the wall 120 is rectangular. However, in other embodiments, the wall 120 may have a cross-section (not shown) that is hemispherical, ellipsoid, convex, concave or trapezoidal. Polygonal cross-sections such as square, octagonal or pentagonal are also possible.

The base plate 104 includes an opening 122 in communication with the at least one channel system 110s of the base plate 104. The opening 122 is provided on an outer surface of the base plate 104. The opening 122 allows for fluid to be extracted or introduced into the base plate 104. Extraction may be performed when the fluid has reached above a predetermined temperature and the heated fluid is replaced with cool water. The extracted heated fluid can be piped for other uses. In another embodiment (not shown) where the base plate 104 is air-cooled, the at least one channel system 110s of the base plate 104 is sealed within the base plate 104, wherein the fluid for cooling the solar cell 102 is within the at least one channel system 110s.

As shown in FIG. 1, the base plate 104 has a channel system 110s comprising a plurality of channels 110. The plurality of channels 110 are arranged in parallel to each other.

Comparing the channels 108 in the lens 106 with the channels 110 in the base plate 104, one or more of the channels 108 of the lens 106 is arranged in parallel to one or more of the channels 110 of the base plate 104. By having these channels 108 and 110 run parallel to each other, the solar energy converter 100 has a degree of flexibility in that the base 100b and the top 100t of the solar energy converter 100 can follow the contour of the surface upon which the solar energy converter 100 is placed. Thus, a flat planar surface is not required. Such a design may be advantageous for use with thin film solar cells for the solar cell 102, to manufacture a solar energy converter 100 that can be contoured.

The embodiment of FIG. 1 shows the solar energy converter 100 as a disconnected structure (i.e. the lens 106 is separated from the solar cell 102, and the base plate 104 is separated from the solar cell 102). However, in another embodiment (not shown), the first surface 106f of the lens 106 is secured directly to the solar cell 102 and therefore rests on the solar cell 102, while the solar cell 102 is secured directly to the base plate 104, so that the solar cell 102 rests on the first surface 104f of the base plate 104. In yet another embodiment (not shown), only the solar cell 102 is secured directly to the base plate 104, so that the solar cell 102 rests on the first surface 104f of the base plate 104, while the lens 106 is proximate to the solar cell 102 but does not rest directly on the solar cell 102.

Figure 2:
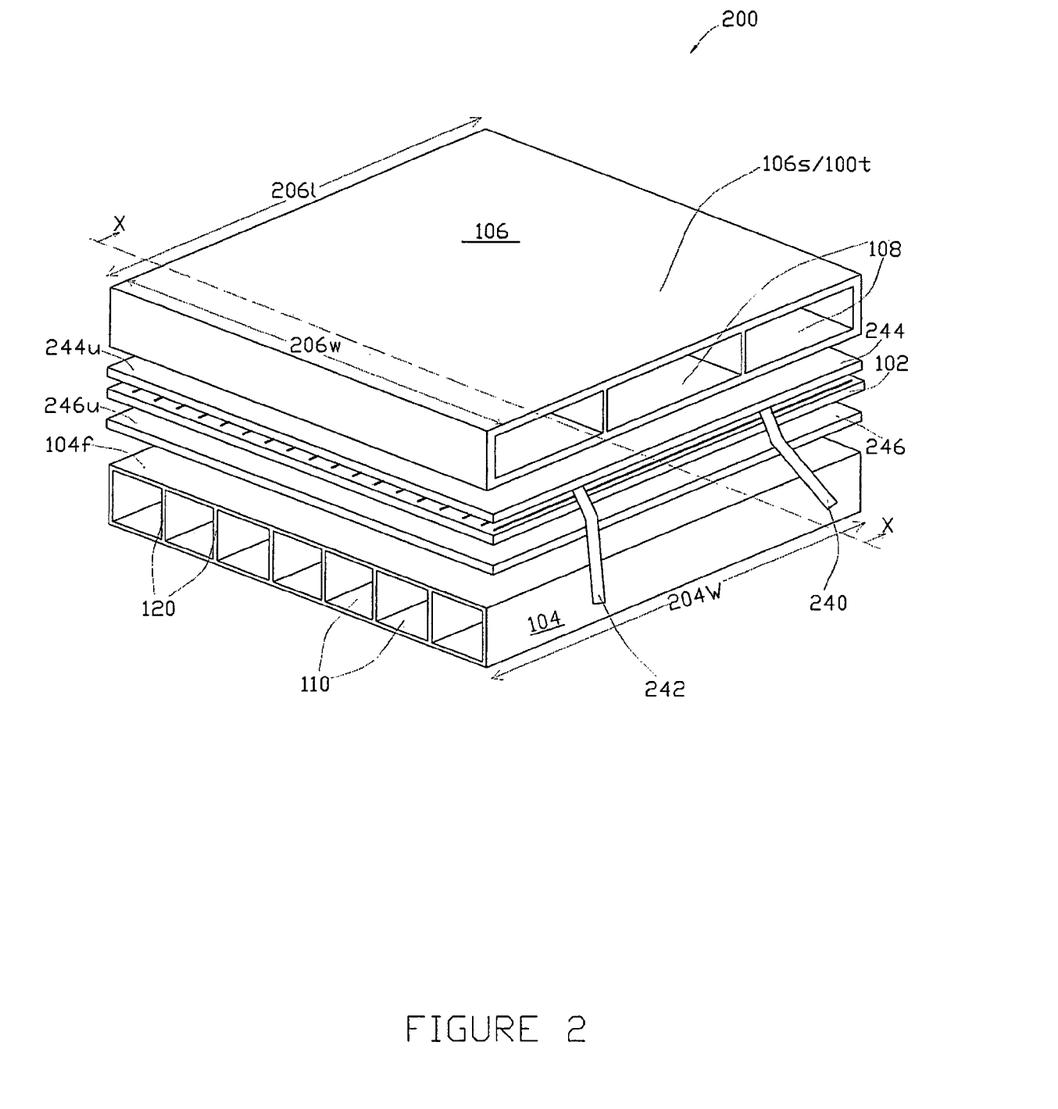
FIG. 2 shows an exploded view of a solar energy converter in accordance with an embodiment.

FIG. 2 shows an exploded view of a solar energy converter 200 in accordance with an embodiment.

Similar to FIG. 1, the solar energy converter 200 has a solar cell 102 located between a base plate 104 and a lens 106.

The base plate 104 has a first surface 104f that faces the solar cell 102 and a second surface (hidden from view) that is opposite to the first surface 104f, wherein the second surface is exposed to form an outer surface of the solar energy converter 100. The first surface 104f of the base plate 104 and the second surface of the base plate 104 have identical shapes. In addition, the first surface 104f of the base plate 104 has a boundary and the second surface of the base plate 104 has a boundary, wherein the boundary of the first surface 104f of the base plate 104 is identical to the boundary of the second surface of the base plate 104.

The lens 106 has a first surface (hidden from view) that faces the solar cell 102 and a second surface 106s that is opposite to the first surface, wherein the second surface 106s is exposed to form an outer surface 100t of the solar energy converter 100. The first surface of the lens 106 and the second surface 106s of the lens 106 have identical shapes. In addition, the first surface of the lens 106 has a boundary and the second surface 106s of the lens 106 has a boundary, wherein the boundary of the first surface of the lens 106 is identical to the boundary of the second surface 106s of the lens 106.

The solar cell 102 is sandwiched between the lens 106 and the base plate 104, wherein both the lens 106 and the base plate 104 are each provided with a channel system (denoted 110s for the base plate 104 and 108s for the lens 106) having at least one channel (denoted 110 for the base plate 104 and 108 for the lens 106) for fluid for cooling the solar cell 102. As shown in FIG. 2, each of the lens 106 and the base plate 104 has a plurality of channels 108 and 110.

The solar cell 102 is provided with wire connections 240 and 242 to tap the electricity converted by the solar cell 102 from solar energy or ambient light.

The differences between the solar energy converter 200 and the solar energy converter 100 are described below.

In the embodiment of FIG. 2, one or more or all of the at least one channel 108 of the lens 106 is arranged perpendicular to one or more or all of the at least one channel 110 of the base plate 104 (in FIG. 1, the solar energy converter 100 has the channels 108 of its lens 106 arranged parallel to the channels 110 of the base plate 104).

By having the channels 108 and channels 106 arranged perpendicular to each other, the solar energy converter 200 has a strong and rigid structure.

An adhesive layer 244 is provided between the lens 106 and the solar cell 102. An upper surface 244u of the adhesive layer 244 is in contact with the lens 106 (or more specifically the first surface of the lens 106) and a lower surface (hidden from view) of the adhesive layer 244 is in contact with the solar cell 102.

In one embodiment, the upper surface 244u may have the same surface area as the first surface of the lens 106 to ensure maximum adhesion of the lens 106 to the solar cell 102.

Another adhesive layer 246 is provided between the solar cell 102 and the base plate 104. An upper surface 246u of the adhesive layer 246 is in contact with the solar cell 102 and a lower surface (hidden from view) of the adhesive layer 246 is in contact with the first surface 104f of the base plate 104.

In one embodiment, the upper surface 246u may have the same surface area as the facing surface of the solar cell 102 to ensure maximum adhesion of the solar cell 102 to the base plate 104.

The thickness of the adhesive layers 244 and 246 is chosen so that heat conduction between the cooling fluid in the channels 108 and 110 and the solar cell 102 is not adversely affected. The adhesive layers 244 and 246 may be fabricated from ethylene vinyl acetate. During manufacture, the adhesive layers 244 and 246 are vacuum pressed together with the solar cell 102, the base plate 104 and the lens 106.

Figure 3:
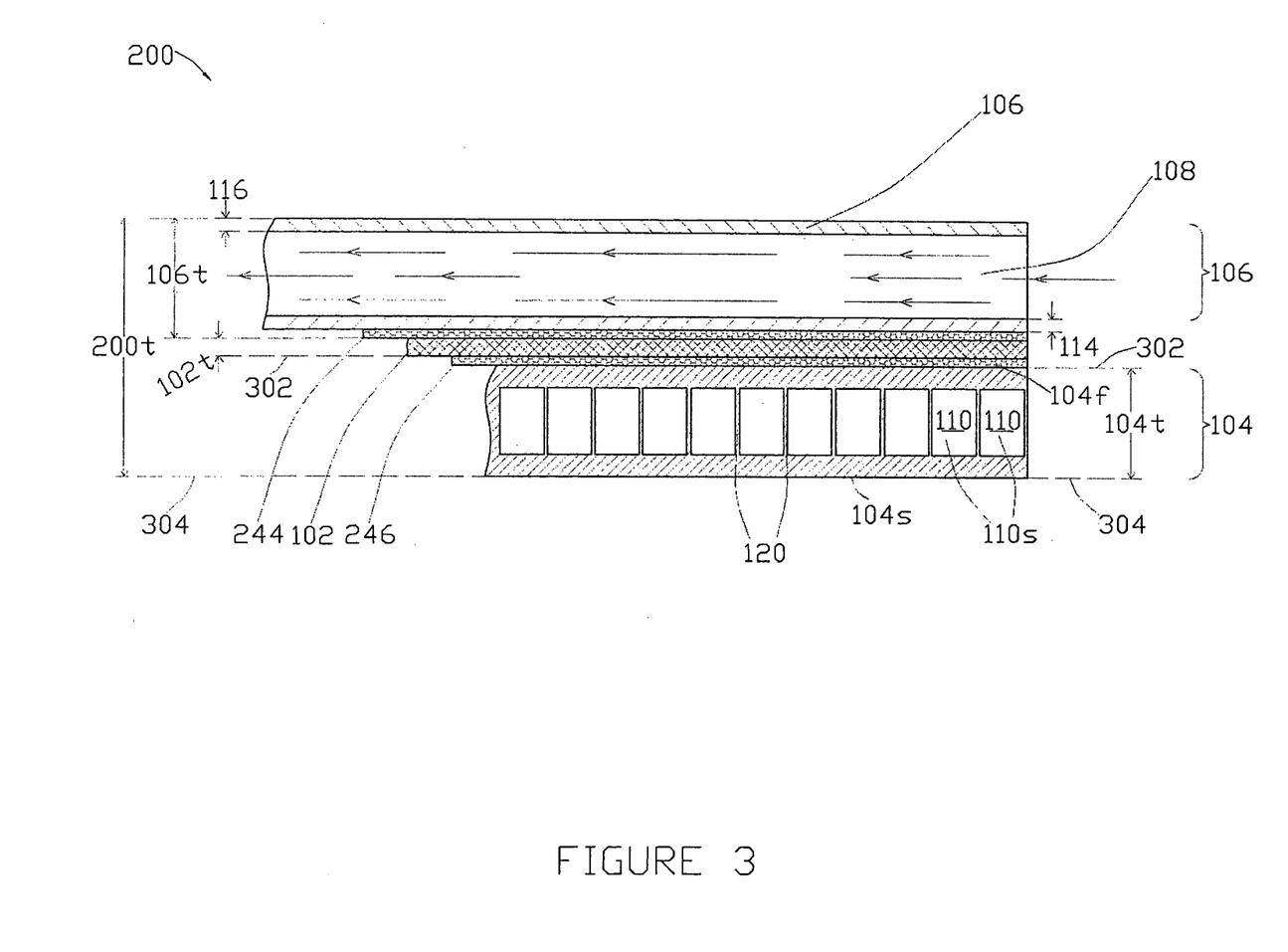
FIG. 3 shows a cross section view of a solar energy converter in accordance with an embodiment.

FIG. 3 shows a cross section view of the solar energy converter 200 of FIG. 2 taken along the line X-X in FIG. 2. While FIG. 2 shows an exploded view, FIG. 3 shows the solar energy converter 200 in its assembled form where the adhesive layer 244 secures the lens 106 to the solar cell 102, and the adhesive layer 246 secures the solar cell 102 to the base plate 104.

The at least one channel system 110s of the base plate 104 is positioned between the plane 302 on which the boundary of the first surface 104f of the base plate 104 lies and the plane 304 on which the boundary of the second surface 104s of the base plate 104 lies.

FIG. 4A shows a top view of the solar energy converter 200 of FIG. 2. The lens 106 is shown as a transparent object, but for the sake of simplicity, the other components of the solar energy converter 200 that can be seen through the lens 106 are omitted so that only the second surface 106s of the lens 106 is shown in FIG. 4A.

FIG. 4B shows a cross section view of the solar energy converter 200 of FIG. 4A taken along the line Y-Y in FIG. 4A.

FIG. 4C shows a cross section view of the solar energy converter 200 of FIG. 4A taken along the line X-X in FIG. 4A.

Similar to FIG. 3, FIGS. 4B and 4C show the solar energy converter 200 in its assembled form.

FIG. 4D shows an enlarged view of section 408 of FIG. 4B, while FIG. 4E shows an enlarged view of section 412 of FIG. 4C.

For FIGS. 4D and 4E, it was mentioned above that the arrangement of the recess 416 and the wall 112 provides the lens 106 with a shock absorbing mechanism. In FIGS. 4D and 4E, the recess 416 is formed on the first surface 106f of the lens 106. However, in another embodiment (not shown), the recess 416 may be formed in the adhesive layer 244 that is between the lens 106 and the solar cell 102. In such an embodiment, the adhesive layer 244 will not be a unitary piece, but provided as an array of separate sections.

To further assist the shock absorbing nature of the mechanical arrangement of the recess 416 and the wall 412, the lens 106 may be made of impact absorption material. For example, the lens may be made of a material the hardness of which is less than the hardness of the base plate.

Any of the components used in the solar energy converter 100 and 200 (such as the base plate 104 or the lens 106) may be manufactured separately and therefore individually used in existing solar energy converter systems.

It is also possible to have a base plate or a lens which has only selected features of the base plate 104 and the lens 106 as respectively mentioned above.

Figure 5:
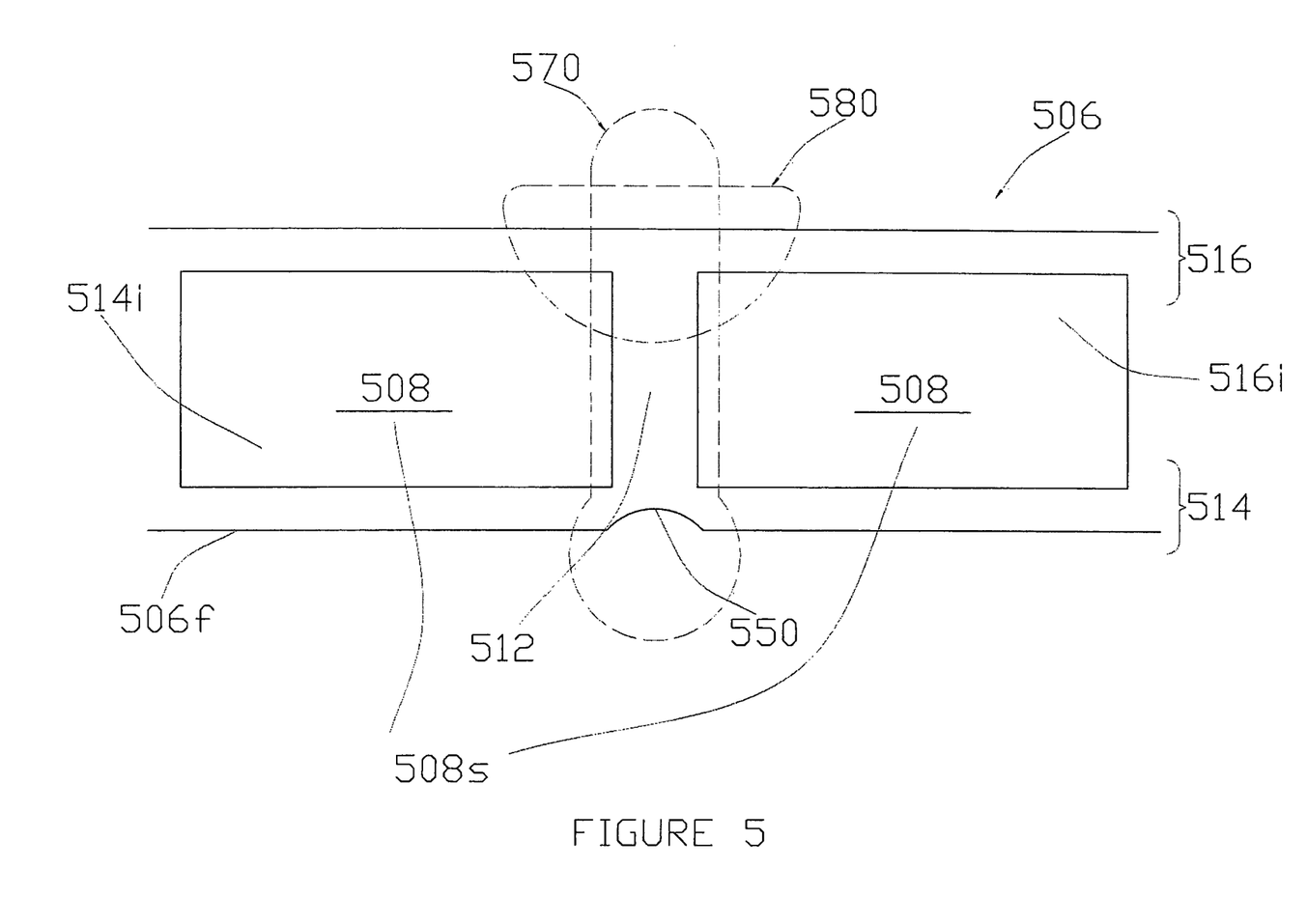
FIG. 5 shows a cross section view of a lens built in accordance with an embodiment.

For instance, FIG. 5 shows a cross section view of a lens 506 built in accordance with an embodiment.

In the embodiment shown in FIG. 5, the lens 506 has the shock absorbing mechanism described in FIGS. 4D and 4E.

The lens 506 has a base section 514 and a top section 516 that is opposite to the base 514. The outer surface 506f of the base 514 has at least one recess 550.

The lens 506 has at least one channel system 508s comprising one or more channels 508 being a chamber or cavity formed in the lens 506. The channels 508 are separated by a wall 512 formed within the lens 506 and located opposite to the at least one recess 550. The wall 512 protrudes from an inner surface 514i of the base 514 of the lens 106 opposite to where the recess 550 is located.

The arrangement of the recess 550 and the wall 512 provides the lens 506 with a shock absorbing mechanism 570. When an object impacts on the portion 580 of the top section 516 of the lens 506 (i.e. the portion of the lens 506 opposite to the inner surface 514i of the lens 106), the wall 512 moves to occupy the space provided by the recess 416, thereby dissipating the concussion of the impact.

A plurality of such shock absorbing mechanisms 570 may be disposed across the lens 506 at regular or irregular intervals, so that the lens 106 is provided with several impact points.

In the embodiment shown in FIG. 5, the wall 512 extends across the space defined between the inner surface 514i and the inner surface 516i of the lens 106. In another embodiment (not shown), the wall 512 only extends from the inner surface 514i of the base section 514, but does not contact with the inner surface 516i of the top section 516 of the lens 506.

Referring to FIGS. 1 to 4, each of the base plate 104, the lens 106 and the solar cell 102 may have a respective thickness 104t, 106t and 102t that is constant. The lens 106, the solar cell 102 and the base plate 104 are parallel to each other. The lens 106 may be fabricated from materials such as glass or polymer or any other suitable material. The base plate 104 may be fabricated from materials such as polymer or any suitable material.

Polymer that may be used to fabricate the lens 106 and/or the base plate 104 include poly(methyl methacrylate) (PMMA), polycarbonate, acrylic, thermoplastics and thermosetting plastics. By using polymer to fabricate the lens 106 and the base plate 104, the solar energy converter 100/200 can follow the contour of the surface upon which the solar panel 100/200 is placed, especially when the channels 108 of the lens 106 and the channels 110 of the base plate 104 run parallel to each other (see FIG. 1). In addition, using the same material to fabricate the lens 106 and the base plate 104 simplifies production reduces production costs. The lens 106 and the base plate 104 may be fabricated using an extrusion and injection molding process.

With reference to FIGS. 2 and 3, the solar energy converter 200 may have a width 206w of around 70 cm and a length 206l of around 1.0 m, and the thickness 200t may be less than both the width and the length. It will be appreciated that other dimensions are possible.

The fluid for heat absorption and cooling the solar cell 102 may be a liquid (such as water) or a gas (such as air). The solar cell 102 may also belong to an array of solar cells sandwiched between the base plate 104 and the lens 106.

It is also possible for the base plate 104 to be fabricated from metal such as aluminum.

In one embodiment (not shown) where metal is used to fabricate the base plate 104, the base plate 104 may be a heatsink with a cooling fin. In this embodiment, the channel of the base plate 104 may be formed on the first surface 104$f$ or the second surface 104$s$ of the base plate 104. A fin structure is formed on the first surface 104$f$ or the second surface 104$s$ of the base plate 104, wherein the at least one channel of the base plate 104 is defined by the space between two adjacent fins of the fin structure.

According to various embodiments, the lens 106 is fabricated with internal passages (the channel 108) of various shapes and sizes having various heat absorbing mediums. The heat absorbing mediums first absorb heat from the sun before it heats up the solar cell 102 and also absorb heat from the solar cell 102. The various heat absorbing mediums may freely flow through these internal passages, where the various heat absorbing mediums are sealed within the lens 106 or allowed to exit from the lens 106. A back support plate (the base plate 104) is fabricated with corrugated cooling channels 110 of various shapes and sizes having various heat absorbing mediums. The various heat absorbing mediums may freely flow through these corrugated cooling channels 110, where the various heat absorbing mediums are sealed within the back support plate or allowed to exit from the back support plate. The absorption of heat via the various heat absorbing mediums in the lens 106 and the back support plate improves the efficiency of the solar energy converter 100/200.

The lens 106 is placed in contact with a substrate (such as the adhesive layer 244) which is in contact with the solar cell 102. Heat from the sun is first absorbed by the heat absorbing medium in the lens 106, and heat from the solar cell 110 is absorbed by the heat absorbing medium sealed in the passages of the lens 106 (or in the case where the heat absorbing medium is allowed to exit from the lens 106, as the heat absorbing medium flows through the passages) thereby reducing the temperature of the solar cell 102. The lens 106 may be fabricated from plastic using an extrusion and injection moulding process. However, other lighter density materials with sufficient clarity and other fabrication processes may also be used.

The back support plate may be fabricated using various fire-retardant materials with corrugated cooling channels in various shapes and sizes using an extrusion and injection moulding process to allow additional heat transfer thereby further reducing the temperature of the solar cell 102. However, other materials and other fabrication processes may be used. The lens 106 and the back support plate can be contoured such that solar energy converter 100/200 can be flexed into various shapes and forms.

Figure 6:
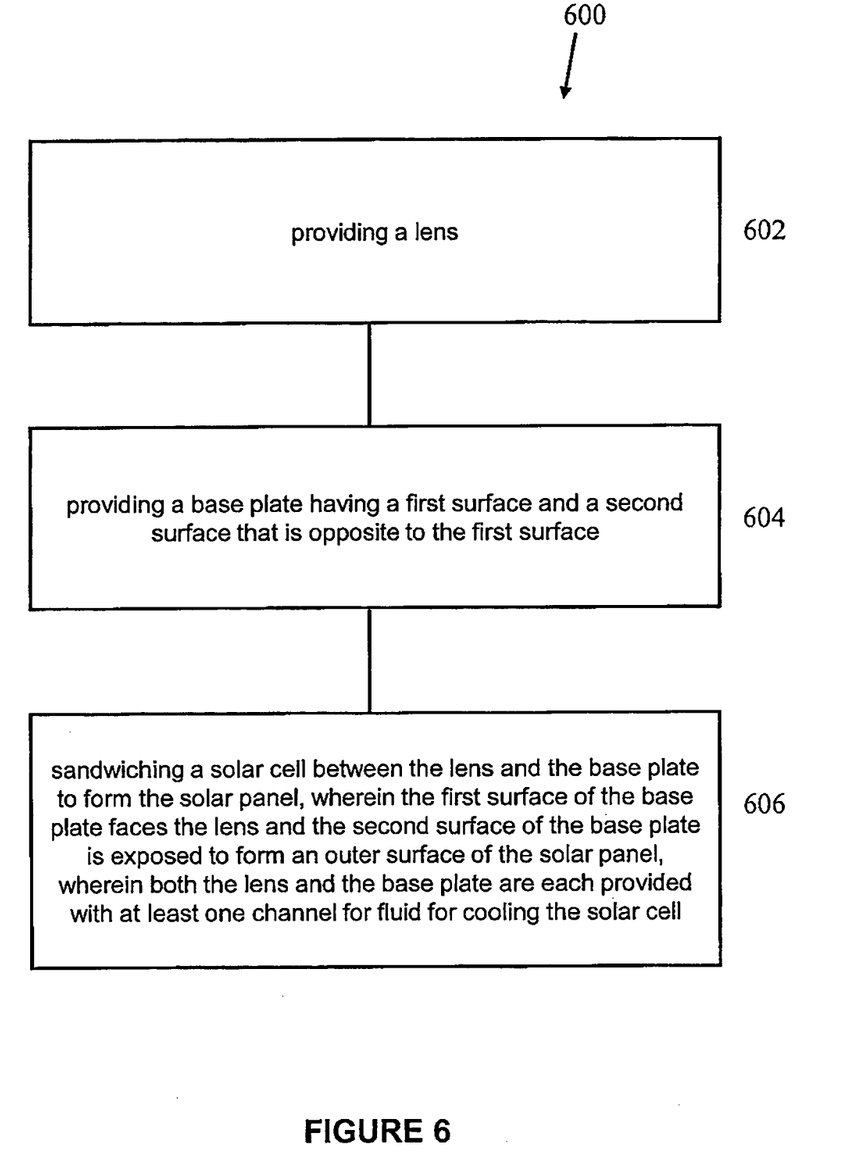
FIG. 6 shows a flow chart of an exemplary fabrication process to manufacture a solar energy converter in accordance with an embodiment.

FIG. 6 shows a flow chart 600 of a fabrication process to manufacture a solar panel in accordance with an embodiment.

The fabrication process begins at 602 where a lens is provided. At 604, a base plate having a first surface and a second surface that is opposite to the first surface is provided. At 606, a solar cell is sandwiched between the lens and the base plate to form the solar energy converter. The first surface of the base plate faces the lens and the second surface of the base plate is exposed to form an outer surface of the solar energy converter. Both the lens and the base plate are each provided with at least one channel for fluid for heat absorption and cooling the solar cell.

The invention claimed is:

1. A solar energy converter comprising:
a lens;
a base plate having a first surface that faces the lens and a second surface that is opposite to the first surface; and
at least one solar cell sandwiched between the lens and the base plate, wherein the lens and the base plate each comprises at least one channel system therein configured for receiving or guiding fluid for cooling the at least one solar cell, and the lens is disposed on a surface of the at least one solar cell.

2. The solar energy converter according to claim 1, wherein at least one of the lens and the base plate are provided with at least one fin for cooling the at least one solar cell.

3. The solar energy converter according to claim 1 or 2, wherein the second surface of said base plate is exposed to form an outer surface of the solar energy converter.

4. The solar energy converter according to claim 1 or 2, wherein an array of solar cells is sandwiched between the lens and the base plate.

5. The solar energy converter according to claim 1 or 2, wherein the channel system of the lens comprises a plurality of channels that are in fluid connection with each other.

6. The solar energy converter according to claim 1, wherein the lens comprises a plurality of channels that are arranged in parallel with regard to each other, and wherein these parallel channels of the lens belong to a same channel system of the lens or belong to different channel systems of the lens.

7. The solar energy converter according to claim 1 or 2, wherein the channel system of the base plate comprises a plurality of channels that are in fluid connection with each other.

8. The solar energy converter according to claim 1, wherein the base plate comprises a plurality of channels that are arranged in parallel with regard to each other, and wherein these parallel channels belong to a same channel system of the base plate or belong to different channel systems of the base plate.

9. The solar energy converter according to claim 1, wherein said at least one channel system of the lens is arranged in parallel with said at least one channel system of the base plate.

10. The solar energy converter according to claim 1, wherein the said at least one channel system of the lens is arranged perpendicular to said at least one channel system of the base plate.

11. The solar energy converter of claim 1, wherein the lens comprises an opening in communication with the at least one channel system of the lens, the opening being provided in an outer surface of the lens.

12. The solar energy converter of claim 1, wherein the at least one channel system of the lens is sealed within the lens, wherein fluid for heat absorption and cooling the solar cell is within the at least one channel system of the lens.

13. The solar energy converter of claim 1, wherein the base plate comprises an opening in communication with the at least one channel system of the base plate, the opening being provided in an outer surface of the base plate.

14. The solar energy converter of claim 1, wherein the at least one channel system of the base plate is sealed within the base plate, wherein the fluid for cooling the solar cell is within the at least one channel system.

15. The solar energy converter of claim 1, further comprising at least one of an adhesive layer between the lens and the solar cell, wherein an upper surface of the adhesive layer is in contact with the lens, and wherein a lower surface of the adhesive layer is in contact with the solar cell or an adhesive layer between the solar cell and the base plate, wherein an upper surface of the adhesive layer is in contact with the solar cell and a lower surface of the adhesive layer is in contact with the first surface of the base plate.

16. The solar energy converter of claim 1, wherein at least one channel of the at least one channel system of the base plate is formed in or on the first and/or second surfaces of the base plate, said at least one channel being in the form of a recess or a groove.

17. The solar energy converter of claim 16, wherein at least one of the first or second surfaces of the base plate is corrugated for providing channels of the at least one channel system of the base plate.

18. The solar energy converter of claim 1, wherein cross-sections of at least one or of all channels of the at least one channel system of the lens are completely surrounded by material of the lens.

19. The solar energy converter of claim 1, wherein cross-sections of at least one or of all channels of the at least one channel system of the base plate are completely surrounded by material of the base plate.

20. The solar energy converter of claim 1, wherein the lens, the solar cell and the base plate are parallel to each other.

21. The solar energy converter of claim 1, the lens having a surface that faces the at least one solar cell, the surface having at least one recess, wherein the lens has at least one wall located between two channels of the at least one channel system, and wherein the at least one wall is located opposite to the at least one recess.

22. The solar energy converter of claim 1, wherein the lens and the base plate are in proximity to the at least one solar cell for cooling the at least one solar cell.

23. A method for cooling a solar energy converter having a lens, a base, and at least one solar cell sandwiched between said lens and said base plate, the method comprising the steps of:

cooling the at least one solar cell on two opposing sides thereof, wherein the lens is arranged on one of the two opposing sides, the base is arranged on another one of the two opposing sides, and cooling of the at least one solar cell is performed by means of a fluid provided in or flowing through at least one first channel system provided in the base plate and by means of a fluid provided in or flowing through at least one second channel system provided in the lens.

24. The method of claim 23, wherein the fluid flowing through the at least one first channel system and/or the fluid flowing through the at least one second channel system is a pressurized fluid.

25. The method of claim 23, wherein the fluid flowing through the at least one first channel system and/or the fluid flowing through the at least one second channel system is a non-pressurized fluid.

* * * * *